USO09939734B2

United States Patent
Dilworth

(10) Patent No.: US 9,939,734 B2
(45) Date of Patent: Apr. 10, 2018

(54) PHOTOLITHOGRAPHY APPARATUS COMPRISING PROJECTION SYSTEM FOR CONTROL OF IMAGE SIZE

(71) Applicant: Liteq B.V., Nuenen (NL)

(72) Inventor: Donald Charles Dilworth, Nuenen (NL)

(73) Assignee: KULICKE & SOFFA LITEQ B.V., Ae Eindhoven (NL)

( * ) Notice: Subject to any disclaimer, the term of this patent is extended or adjusted under 35 U.S.C. 154(b) by 0 days.

(21) Appl. No.: 15/305,164

(22) PCT Filed: Apr. 22, 2015

(86) PCT No.: PCT/EP2015/058641
§ 371 (c)(1),
(2) Date: Oct. 19, 2016

(87) PCT Pub. No.: WO2015/162147
PCT Pub. Date: Oct. 29, 2015

(65) Prior Publication Data
US 2017/0123329 A1 May 4, 2017

(30) Foreign Application Priority Data
Apr. 23, 2014 (EP) .................................... 14165611

(51) Int. Cl.
*G03B 27/54* (2006.01)
*G03F 7/20* (2006.01)
(52) U.S. Cl.
CPC ........ *G03F 7/70641* (2013.01); *G03F 7/7015* (2013.01)
(58) Field of Classification Search
CPC ............. G03F 7/70241; G03F 7/70258; G03F 7/70641; G03F 7/7015
(Continued)

(56) References Cited

U.S. PATENT DOCUMENTS 5,117,255 A * 5/1992 Shiraishi ............. G03F 7/70241
355/52
5,610,754 A 3/1997 Gheen et al.
(Continued)

FOREIGN PATENT DOCUMENTS

CN 1416019 5/2003
CN 1476629 2/2004
(Continued)

OTHER PUBLICATIONS

Chinese Office Action, issued in Chinese Application No. 201580019559.1, dated Nov. 17, 2017.

*Primary Examiner* — Hung Henry Nguyen
(74) *Attorney, Agent, or Firm* — Preti Flaherty Beliveau & Pachios LLP

(57) ABSTRACT

The present disclosure concerns a photolithography apparatus (100) and method for controlling relative image size (S1/S0) of a projected substrate pattern (W). A projection system (10) is arranged for projecting an image of a mask pattern (M) as the substrate pattern (W) onto a substrate (6), wherein the projection system (10) comprises an adjustment lens (13) moveable in a range (Xmin,Xmax) encompassing a central position (X0) for controlling a relative image size (S1/S0). The projection system (10) is arranged to project the mask pattern (M) onto the adjustment lens (13) such that, when the adjustment lens (13) is positioned at the central position (X0), an apparent mask pattern (M') from a point of view of the adjustment lens (13) appears to be at a distance (2*F) from the adjustment lens (13) that is twice a focal length (F) of the adjustment lens (13).

15 Claims, 5 Drawing Sheets

(58) Field of Classification Search
USPC .................................... 355/52, 53, 55, 67
See application file for complete search history.

(56) References Cited

U.S. PATENT DOCUMENTS

| | | | |
|---|---|---|---|
| 6,312,859 B1* | 11/2001 | Taniguchi | G03F 7/70258 |
| | | | 430/22 |
| 6,665,049 B1* | 12/2003 | Takahashi | G03F 1/62 |
| | | | 355/53 |
| 2003/0042920 A1 | 3/2003 | Kenmoku | |
| 2005/0243295 A1 | 11/2005 | de Jager et al. | |

FOREIGN PATENT DOCUMENTS

| | | |
|---|---|---|
| CN | 101135864 | 3/2008 |
| WO | 2001/13177 | 2/2001 |

* cited by examiner

PHOTOLITHOGRAPHY APPARATUS COMPRISING PROJECTION SYSTEM FOR CONTROL OF IMAGE SIZE

TECHNICAL FIELD AND BACKGROUND

The present disclosure relates to a photolithography apparatus comprising a projection system and a method for controlling an image size of a projected substrate pattern.

Photolithography is a process used in micro- or nanofabrication to pattern parts a substrate. Typically, it uses light to transfer a mask pattern from a mask to a light-sensitive chemical ("photoresist") on the substrate. For example, a photolithography apparatus comprises or couples to an illumination system with a light source and/or beam shaper for providing the light to the mask. The mask pattern is imaged by a projection system onto the substrate. The projection system comprises optical elements such as curved mirrors and/or lenses to control the magnification, position and/or focusing of the projected image.

As used in the microlithography industry, such optical elements typically achieve high resolution to resolve structures in the mask, e.g. close to the theoretical diffraction limit. When applying successive layers to a substrate, the images typically needs to be superimposed to an accuracy that is a fraction of that resolution. However, when an environmental condition such as the temperature or air pressure changes, the scale and/or focusing of the image may be affected. This can be further complicated when layers are applied by different machines. Accordingly, it is desired to accurately control the relative image size of a projected substrate pattern.

In a typical projection system, control of the image size can be achieved by moving a lens along the optical axis for adjusting the magnification. However, this may generally also influence a position of the image plane thus leading to a blurring of the projected substrate pattern. The shift of the image plane can be compensated by simultaneously moving a second adjustment lens or even the position of the substrate itself. However, this requires two adjustments that are generally unequal and difficult to coordinate, e.g. non-linear.

U.S. Pat. No. 6,816,236 discloses a projection optical system that includes six lens groups, four of which are positioned in pairs symmetrically about a stop. The second and fifth lens groups, in order from the object side, may be positioned symmetrically about the stop but are also adjustable asymmetrically about the stop in order to adjust the magnification of the projection optical system. The first and sixth lens groups, in order from the object side, function to make the projection optical system substantially telecentric on both the object side and the image side, respectively. A projection and light exposure apparatus automatically detects the image magnification and, based on the detection result, adjusts the positions of the second and fifth lens groups as a unit so as to maintain a specified magnification.

Unfortunately, the prior art solution is limited to lens groups that are positioned in pairs symmetrically about a stop. Furthermore, because the prior art relies on controlling the magnification by means multiple lens groups, the imaging may be affected by the relative positioning of said groups. For example the second lens group may shift with respect to the fifth lens group and/or with respect to the third or fourth lens groups therein between as a result of temperature fluctuations in the system. Also when the second and fifth lens groups are not manufactured identical, the image may deteriorate.

Accordingly, there is a desire for a photolithography apparatus comprising a more versatile and robust projection system for controlling the relative image size of a projected substrate pattern.

SUMMARY

A first aspect of the present disclosure provides a photolithography apparatus. The apparatus comprises a mask stage arranged for positioning a mask. The mask comprises a mask pattern for patterning an illumination beam according to the mask pattern. The apparatus further comprises a substrate stage arranged for positioning a substrate for receiving a substrate pattern onto the substrate. The apparatus further comprises a projection system arranged for projecting an image of the mask pattern as the substrate pattern onto the substrate. The projection system comprises an adjustment lens moveable in a range encompassing a central position for controlling a relative image size of the projected substrate pattern by a relative position of the adjustment lens. The projection system is arranged to project the mask pattern onto the adjustment lens such that, when the adjustment lens is positioned at the central position, an apparent mask pattern from a point of view of the adjustment lens appears to be at a distance from the adjustment lens that is twice the focal length of the adjustment lens.

It is found that when a mask pattern from a point of view of the adjustment lens appears at a distance that is twice a focal length of the lens, the lens can be moved to adjust the relative size of the projected image with minimal influence on the position of the image plane. Accordingly, the image size of the projected substrate pattern can be controlled in a simple manner without having to compensate for shifts of the image focus. The projection system can be more versatile because it is not limited to further conditions. The projection system can be more robust because it does not rely on a plurality of interrelated optical elements for controlling the image size.

Without going deeply into theory, a possible explanation can be as follows. It is generally noted that if an object is placed at a distance equaling twice the focal length of a lens, the lens is set to project a corresponding image of the object at the same distance on the other side of the lens wherein the lateral magnification is unity, i.e. the image is the same size as the object. Furthermore, it is noted that the longitudinal magnification of a lens is generally proportional to the square of its lateral magnification. Accordingly, when the lens is arranged to operate at unity lateral magnification, displacement of an object by a small distance towards or away from the lens, result in similar displacement of the corresponding image location in the same direction. Similarly, if the lens itself is moved along the optical axis by a small distance, the location of the image plane remains unchanged to first order while distances between the lens and the object and between the lens and the image are changed. The lateral magnification being the ratio of those latter two distances, it follows that the lateral magnification can be altered with negligible change in focus position.

It is noted that the distance at which the mask appears from a point of view of the adjustment lens may be different than the actual distance between the lens and mask. For example, when further optical elements are arranged in between the mask and adjustment lens, the apparent distance from a point of view of the adjustment lens can be altered. The position at which the mask appears can be in front of the lens (on the same side as the mask) or behind the lens depending on whether the adjustment lens is a positive or negative lens. In case of a negative lens the focal length may be described by a negative number and the distance to the apparent mask pattern described by a negative distance when it appears at the other side of the lens (virtual object) than the light origin.

The adjustment lens at the central position is preferably arranged for providing a magnification factor 1:1 between a size of the apparent mask pattern and a size of an apparent substrate pattern from a point of view of the adjustment lens. However, the projection system as a whole can operate at another magnification factor. For example, if the zooming element is located in a portion of the projection system where the light is approximately collimated, then the distant object and image as seen by that element may satisfy the above condition, provided they appear equally distanced. Generally, it is preferred that a degree of collimation of light entering the adjustment lens at the central position equals a degree of collimation of light exiting the adjustment lens. The remaining elements can provide any magnification desired by the lens designer. Accordingly, the projection system can be more versatile.

By moving the adjustment lens as a single unit without optical elements therein between, the projection system can be further simplified and more robust. For example, the adjustment lens can be moved by a single mechanism. Because no other (stationary) optical elements are arranged in between adjustment lenses, these do not influence the imaging by their relative position and/or angle By using a single lens element as the adjustment lens, the projection system can be further simplified and more robust. For example, it is not required to move multiple lens elements for adjusting an image size. Furthermore the single lens element can be more robust than a collection of lens elements whose relative position may be influenced e.g. by temperature thereby affecting the image size and/or focusing condition. Furthermore, it is not required to manufacture a pair of exactly the same lens elements. Furthermore, the width of the adjustment lens, i.e. a length of the optical axis between the first and last surfaces of the adjustment lens can be smaller. A thinner adjustment lens may be less affected by mechanical or transmission problems. Accordingly, it can be desired that the adjustment lens has a thickness of less than 10 cm, preferably less than 5 cm, more preferably less than 1 cm. It is noted that the lens can also be thinner if it has a larger focal length.

By using an adjustment lens with a large focal length, the magnification can be more accurately controlled within a desired range. It will be appreciated that for a larger focal length, the adjustment lens can be moved over a considerable distance to adjust the magnification with minimal effect on the position of the image plane. For example, it can be desired to provide an adjustment lens with a focal length of more than 5 meters, preferably more than 10 meters, more preferably more than 20 or even more than 40 meters. The larger the focal length, the more accurate the magnification can be controlled. On the other hand, if the focal length is too large, the lens may need excessive movement to adjust magnification. Accordingly, it is typically desired that the focal length is less than 1000 meters, preferably less than 100 meters, e.g. around 50 meters.

By adding a further lens on the image side of the adjustment lens, the image plane of the projection system as a whole can be at a different position than the image plane of the adjustment lens alone. For example, the actual substrate pattern can be projected closer to the lens than the apparent distance of the (virtual) substrate pattern from a point of view of the lens. By projecting the substrate pattern at an image plane of the projection system having a lower distance to the adjustment lens (e.g. wherein the distance is a fraction of the focal length of the adjustment lens) while the apparent image plane from a point of view of the adjustment lens is approximately twice the focal length of the adjustment lens, the maintenance of the image plane position can be further improved while providing accurate adjustment of the relative image size, especially when using a relatively weak adjustment lens.

By arranging the projection system to increase a distance of the apparent mask pattern from the point of view of the adjustment lens, the apparatus can be more compact. For example, it is not needed to actually place the mask at a large distance from the adjustment lens when the focal length is large. Instead, e.g. collimating optics can be placed between adjustment lens and the mask pattern. By projecting the patterned light with increased collimation (i.e. more parallel light paths) onto the adjustment lens the apparent distance of the mask pattern can be increased from the point of view of the adjustment lens. Similarly, by arranging the projection system to decrease an actual distance between the image plane and the adjustment lens, the apparatus can be more compact. For example, it is not needed to place the substrate at a large distance from the adjustment lens. By arranging the adjustment lens centrally in the projection system, the same or similar optical components can be used on either side, possibly reducing production costs.

It is noted that if the adjustment lens is moved over an excessive distance from the central position compared to the focal length of the lens, a second order focus shift may be encountered. Accordingly, the method of adjusting magnification while maintaining the image focus is particularly suited for small image size adjustments. Advantageously, the useable range corresponds to the typical adjustments of the relative image size desired in the microlithography industry. To limit the focus shift, it can be opted to limit movement of the adjustment lens to stay within a maximum distance from the central position. Preferably, this maximum distance is less than one-tenth ($1/10$) of the focal length, more preferably less than one-hundredth ($1/100$) of the focal length, even more preferably less than one-thousandth ($1/1,000$) of the focal length. The less the relative movement of the adjustment lens compared to the focal length, the less the image plane displaces. On the other hand some relative movement may be needed to sufficiently adjust the relative image size. Accordingly, it is preferred that the maximum distance is at least one-hundred-thousandth ($1/100,000$) times the focal length, preferably more than one-ten-thousandth ($1/10,000$) of the focal length, e.g. around one-three-thousandth ($1/3,000$) times the focal length.

By providing a controller the relative position of the adjustment lens can be accurately and/or automatically controlled for adjusting the relative image size of the projected substrate pattern. For example, the controller can control the relative position of the adjustment lens in response to a measured temperature change. Alternatively or in addition, by providing an image sensor, the image size of the projected substrate pattern can be automatically detected. The controller can adjust the position of the adjustment lens as a function of the detected image size for obtaining or maintaining a desired image size.

A second aspect of the present disclosure provides a method for controlling a relative image size of a projected substrate pattern in a photolithography apparatus. The method comprises using a projection system for projecting the substrate pattern as an image of a mask pattern. The projection system comprises an adjustment lens for adjusting the relative image size of the projected substrate pattern. The method further comprises controlling a relative position of the adjustment lens around a central position thereby controlling the relative image size of the projected substrate pattern. The projection system is arranged to project the mask pattern onto the adjustment lens such that, when the adjustment lens is positioned at the central position, an apparent mask pattern from a point of view of the adjustment lens appears to be at a distance from the adjustment lens that is twice a focal length of the adjustment lens.

It will be appreciated that this method can be advantageously applied to provide a more versatile and robust projection system for similar reasons as described above.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
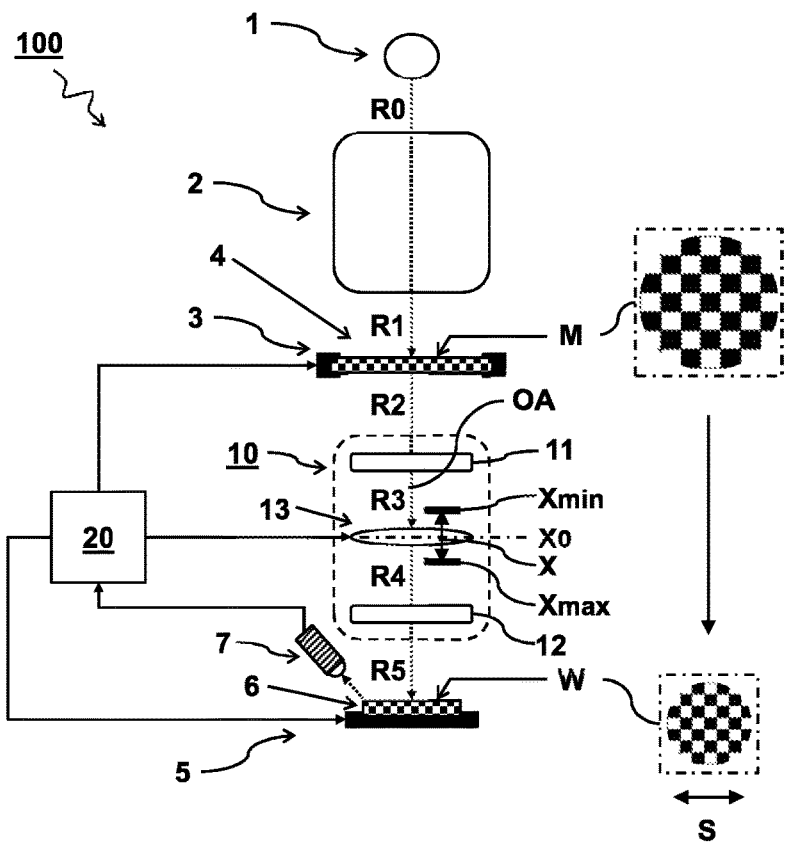
FIG. 1A shows a schematic view of an embodiment of a photolithography apparatus.

Unless otherwise defined, all terms (including technical and scientific terms) used herein have the same meaning as commonly understood by one of ordinary skill in the art to which this invention belongs as read in the context of the description and drawings. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some instances, detailed descriptions of well-known devices and methods may be omitted so as not to obscure the description of the present systems and methods. Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise. All publications, patent applications, patents, and other references mentioned herein are incorporated by reference in their entirety. In case of conflict, the present specification, including definitions, will control.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The description of the exemplary embodiments is intended to be read in connection with the accompanying drawings, which are to be considered part of the entire written description. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

FIG. 1A shows a schematic view of an embodiment of a photolithography apparatus 100.

The apparatus 100 comprises or couples to an illumination system arranged for providing an illumination beam R1. For example, radiation R0 from a light source 1 is guided by optical element 2 to provide the illumination beam R1. Preferably, illumination beam R1 comprises a uniform and/ or collimated light beam, e.g. to illuminate a mask 4. The light source 1 and/or optical element 2 may be comprised in the apparatus or separate therefrom.

The apparatus 100 comprises a mask stage 3 arranged for positioning a mask 4. The positioning may be static or dynamic. The mask 4 comprises a mask pattern M for patterning the illumination beam R1 according to the mask pattern M. The mask may operate e.g. in a transmissive or reflective mode (not shown). The mask may comprise any means to pattern (i.e. mask) the illumination beam R1, such as a reticle or array of individually controllable elements, to determine an image of a desired circuit pattern. Accordingly, the mask pattern M can be formed e.g. by an array of elements having a variable transparency and/or reflectivity to pattern the incoming light. The mask stage 3 and mask 4 can be separate or integrated elements.

The apparatus 100 comprises a substrate stage 5 arranged for positioning a substrate 6. The positioning may be static or dynamic. The substrate 6 is positioned for receiving a substrate pattern W onto the substrate 6. The 'substrate' may comprise any article onto which a desired circuit pattern is to be formed, e.g. typically a wafer or film. The substrate stage 5 may be platform or other means for providing the substrate 6 in a desired location, e.g. rollers. In one embodiment, the substrate stage 5 comprises clamps (not shown) for holding the substrate 6.

The apparatus 100 comprises a projection system 10 arranged for projecting an image of the mask pattern M as the substrate pattern W onto the substrate 6. The projection system 10 comprises an adjustment lens 13 moveable in a range (Xmin to Xmax). The range encompasses a central position X0 for controlling a relative image size S of the projected substrate pattern W. Preferably, though not necessarily, the central position X0 is approximately half way between the minimum value of the range Xmin and the maximum value of the range Xmax. In this way a maximum range of adjustment is provided for changing the image size with minimal impact on the focusing position of the projected image. As used herein, the position X may correspond to a distance measured along the optical axis ("OA") with respect to the central position X0, unless stated otherwise. For example, the image size S is controlled by a position X of the adjustment lens 13 relative to the central position X0 along the optical axis OA.

In one embodiment, the adjustment lens 13 is arranged to be moveable over a maximum distance Xmax from the central position X0. In one embodiment the projection system 10 comprises a track (not shown) along an optical axis OA of the projection system 10 for moving the adjustment lens 13 along the track. The track may e.g. comprise stoppers at one or both ends to limit movement of the adjustment lens 13 therein between. For example, the maximum distance Xmax can be expressed as a fraction of the focal length F (not shown here) of the adjustment lens 13. In one embodiment, the maximum distance is less than one-hundredth of the focal length, i.e. $|Xmax-X0|<0.01*F$. For a relatively small movement of the adjustment lens 13 compared to the focal length F, the effects on the shifting of the image plane can be limited.

In one embodiment, the adjustment lens 13 is a relatively weak lens, e.g. having a focal length of more than 10 meters. In case of a negative lens, the absolute value of the (negative) focal length may be considered in the evaluation of focal power.

In one embodiment, the apparatus automatically detects the image magnification and, based on the detection result, adjusts the positions of the adjustment lens 13 so as to maintain a specified magnification. It can allow for correction of deviation in image magnification, e.g. caused by production errors in components as well as for adjustment of image magnification in accordance with the expansion or contraction of the substrate and/or optical components due to temperature changes.

In one embodiment, the apparatus comprises a controller 20 arranged for adjusting the relative position X of the adjustment lens 13. The relative image size S of the projected substrate pattern W can be controlled by the adjusting of the relative position X. The present disclosure provides a way to adjust the image scale simply by moving a single weak element along the axis of its cell. A lens designed with this scheme in mind can aim the light so the chief ray is parallel to the axis (the telecentric condition) to a sufficient accuracy that the image can be refocused with no appreciable change in magnification (should refocus be required). And the desired matching of the image scale with that of a previously applied pattern can be accomplished with less time and expense. The mechanical lens design can provide a knob that can be turned by the user to dial up any desired magnification change, with no refocusing required.

In one embodiment the apparatus comprises an image sensor 7 arranged for detecting an image size S of the projected substrate pattern W. The controller 20 is arranged for adjusting the position X of the adjustment lens 13 as a function of the detected image size S for obtaining a desired image size.

In the shown embodiment, light R0 is emitted from light source 1, the light is collected by beam shaper 2, resulting in illumination beam R1. The illumination beam R1 impinges onto mask 4, resulting in patterned beam R2. The patterned beam R2 traverses the projection system 10, resulting in image beam R5. While traversing the projection system 10, the beam R2 is shaped by optical element 11, resulting in beam R3 that impinges onto the adjustment lens 13. After traversing the adjustment lens 13, the resulting beam R4 traverses the second optical element 12 of the projection system 10. When resulting image beam R5 impinges the surface of substrate 6, the substrate pattern W is formed thereon.

According to one aspect of the present disclosure, a method is provided for controlling a relative image size S of a projected image, e.g. a substrate pattern W in a photolithography apparatus 100. The method comprises using a projection system 10 for projecting an image W of an object, e.g. a substrate pattern M. The projection system 10 comprises an adjustment lens 13 for adjusting the relative image size S1/S0 of the projected image W. The method further comprises controlling a relative position X of the adjustment lens 13 around a central position X0 thereby controlling the relative image size S1/S0 of the projected image W. The projection system 10 is arranged to project the object M onto the adjustment lens 13 such that, when the adjustment lens 13 is positioned at the central position X0, an apparent object M' from a point of view of the adjustment lens 13 appears to be at a distance from the adjustment lens 13 that is twice a focal length F of the adjustment lens 13, i.e. $P=2*F$.

Of course the embodiments described herein with respect to the photolithographic apparatus can be applied in corresponding embodiments of the method for controlling a relative image size S of a projected image. For example, one embodiment, comprises automatically adjusting the position X of the adjustment lens 13 as a function of a detected image size S for obtaining and/or maintaining a desired image size. One embodiment, comprises moving only a single lens to adjust the image size. In one embodiment, the adjustment lens 13 is moved as a single unit without optical elements therein between.

It will be appreciated that the methods disclosed herein are especially suitable for the imaging of a wafer pattern in a photolithography apparatus, because the desired image size adjustments are relatively small while maintaining the image plane position can be critical. Accordingly, in one embodiment, the object is a mask pattern whose image is projected as a substrate pattern onto a substrate.

Figure 1B:
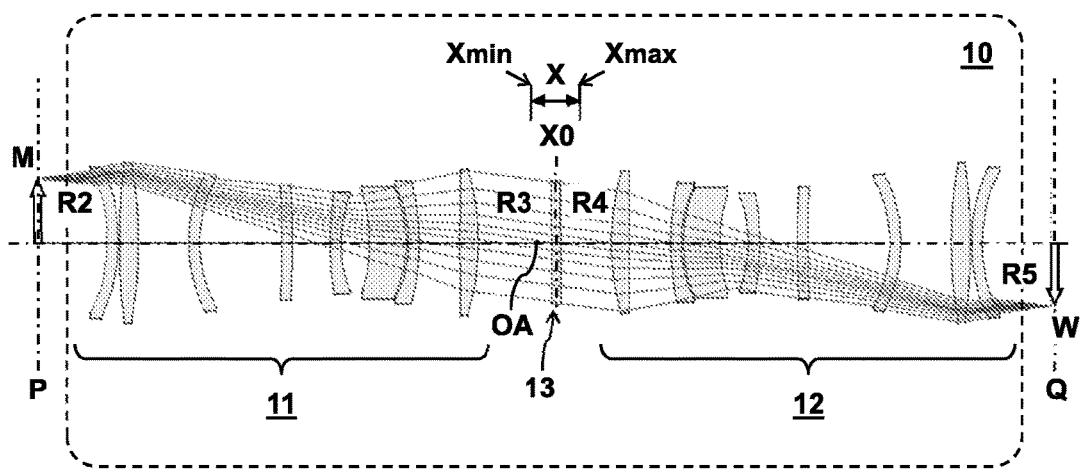
FIG. 1B shows a schematic view of an embodiment of a projection system e.g. for use in the apparatus of FIG. 1A.

FIG. 1B shows a schematic view of an embodiment of a projection system 10 for use in the apparatus 100.

In the shown embodiment, the lens 13 is very weak, having a focal length of about 48 meters, and it moves (zooms) along the axis over a total distance (Xmin to Xmax) of about 16 mm, thereby achieving a change in image scale of about 0.010 mm, which is within an anticipated range of scale changes desired for the present applications.

In one embodiment, the adjustment lens 13 comprises a single lens element. The single lens element has two optical interfaces with a monolithic volume of lens material therein between. The lens element may comprise different layers, e.g. anti-reflection layers. In one embodiment, the adjustment lens 13 is a thin lens. Preferably, the lens has a thickness (e.g. the distance along the optical axis between the said optical interfaces) of less than 10 cm, preferably less. In an alternative or additional embodiment, one or more lens elements (not shown) are moveable as a single unit without optical elements therein between. For example, two or more lenses can be held together to effectively act as a single moveable lens.

In one embodiment, the adjustment lens 13 is arranged centrally in the projection system 10. In one embodiment, the projection system 10 comprises a symmetric arrangement of optical elements 11, 12 around the centrally placed adjustment lens 13. Alternatively, also other arrangements are possible, e.g. having other magnification factors between the mask pattern M and the substrate pattern W.

In one embodiment, the projection system 10 comprises a collimating system 11 arranged between the mask stage and the adjustment lens 13 for increasing a degree of collimation of patterned light R2 from the mask pattern M thereby projecting the patterned light with increased collimation R3 onto the adjustment lens 13. It is noted that by increasing the degree of collimation, light rays from the beam R3 are made more parallel. It will be appreciated that this increases the apparent distance of the mask pattern M from the point of view of the adjustment lens 13. Accordingly, in one embodiment, the projection system 10 is arranged to provide an apparent mask pattern from a point of view of the adjustment lens 13 that appears at a distance that is further away from the adjustment lens 13 than an actual distance to the mask pattern.

The apparent distance can e.g. be established by tracing the light rays from beam R3 back until they cross each other (well outside the present figure). For the purpose of tracing back the apparent origin of the light rays from a point of view of the adjustment lens 13, the collimating system 11 is omitted. The apparent distance to the mask pattern can thus be thought of as the distance where the mask pattern M (with a different size) would need to be placed to achieve the same light rays or phase front of beam R3 impinging on the adjustment lens 13 in absence of any optics between the mask pattern M and adjustment lens 13, in particular in absence of the collimating system 11.

In one embodiment, the projection system 10 comprises a focusing system 12 arranged between the adjustment lens 13 and the substrate stage 5 for decreasing a distance between the adjustment lens 13 and the projected substrate pattern W on the substrate 6. In other words, the image plane Q of the projection system 10 is closer to the adjustment lens 13 than the image plane of the adjustment lens 13 alone (not shown).

In one embodiment, the projection system 10 is arranged with respect to the adjustment lens 13 such that a degree of collimation of light R3 entering the adjustment lens 13 at the central position X0 equals a degree of collimation of light R4 exiting the adjustment lens 13. In other words, the light rays on either side of the adjustment lens 13 have about equal degree of collimation. For example for a positive adjustment lens 13, the rays of beam R3 entering the adjustment lens 13 can be slightly divergent and the rays of beam R4 exiting the adjustment lens 13 can be slightly convergent wherein the diverging rays have the same angle with respect to the optical axis as the converging rays. For a negative adjustment lens 13 the converging and diverging rays can be in reversed order.

Advantageously, the projection system 10 and/or adjustment lens 13 are arranged to project the mask pattern M onto the adjustment lens 13 in a specific way. In particular, the projection system 10 and/or adjustment lens 13 are arranged such that the mask pattern M from a point of view of the adjustment lens 13 appears to be at a distance from the adjustment lens 13 that is twice a focal length of the adjustment lens 13, when the adjustment lens 13 is positioned at the central position X0 in the range of movement of the adjustable lens. This principle will be further explained below with reference to FIGS. 2-6.

Figure 2A:
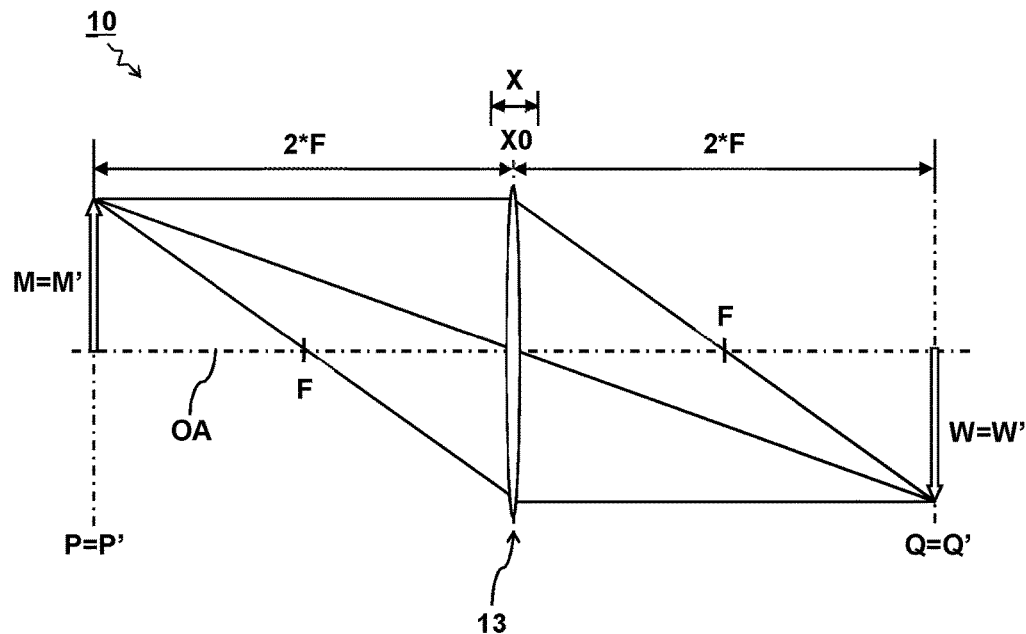
FIG. 2A shows a schematic view of another embodiment of the projection system.

FIG. 2A shows a schematic view of an embodiment of the projection system 10 wherein the adjustment lens 13 is positioned at the central position X0.

As used herein, the reference F indicates a position of the focal plane of the adjustment lens 13. Correspondingly, the reference may also indicate the focal length F of the adjustment lens 13 which is the distance between the adjustment lens 13 and its focal plane. Typically, the focal length F is measured along the optical axis OA e.g. from a center of the adjustment lens 13. The focal length of an optical system is a measure of how strongly the system converges or diverges light, e.g. the distance over which initially collimated rays are brought to a focus. The position of the focal plane F can move by moving the adjustment lens 13 to a position X relative to the central position X0 while the magnitude of the focal length F remains a constant property of the adjustment lens 13.

As used herein, the references P and Q indicate the positions of the object plane and image plane of the projection system 10, respectively. Correspondingly, these references may also indicate the object distance and image distance with respect to the projection system 10. The mask pattern M and wafer pattern W are illustrated by white vertical arrows. The mask pattern M is placed in the object plane P of the projection system 10 resulting in an image of the mask pattern M in the image plane Q of the projection system 10, which image is the substrate pattern W.

As used herein, the references P' and Q' (with apostrophe) indicate the positions of the object plane and image plane, respectively, of the adjustment lens 13. In this embodiment, the projection system 10 only comprises the adjustment lens 13 and no further optics. As a result the object plane P of the projection system 10 coincides with the object plane P' of the adjustment lens 13. Similarly the image plane Q of the projection system 10 coincides with the image plane Q' of the adjustment lens 13. Accordingly, in this embodiment, the apparent mask pattern M' (with apostrophe) from a point of view of the adjustment lens 13 is the same as the actual mask pattern M. Similarly, the apparent substrate pattern W' (with apostrophe) is the same as the actual substrate pattern W. However, in general, when the projection system 10 comprises further optics, the positions of the apparent mask pattern M' and/or apparent substrate pattern W' need not necessarily coincide with the actual mask pattern M and substrate pattern W, respectively, as illustrated with reference to FIGS. 2-5.

In the embodiment, the mask pattern M is placed at a distance from the adjustment lens 13 equaling twice the focal length F of the adjustment lens 13, i.e. P=2*F. Using the lens formula (1/F=1/P+1/Q), it can be deduced that the image W is formed at a distance Q=2*F, i.e. the same distance from the adjustment lens 13 as the object plane P. The magnification can be calculated as the ratio between the object distance P and the image distance Q, i.e. in this case unity. This may also be deduced from a geometric analysis of the three light rays drawn between the mask pattern M and the substrate pattern W. The first (top) ray enters the adjustment lens 13 parallel to the optical axis OA and is bent by the adjustment lens 13 to cross the optical axis OA at the focal position F on the image side of the lens. The second (middle) ray passes straight through a center of the adjustment lens 13. The third (bottom) ray passes through the focal position F on the object side of the lens and is bent by the adjustment lens 13 to be parallel to the optical axis OA. All rays converge to form the tip of arrow symbolizing the image W at the image plane Q.

Figure 2B:
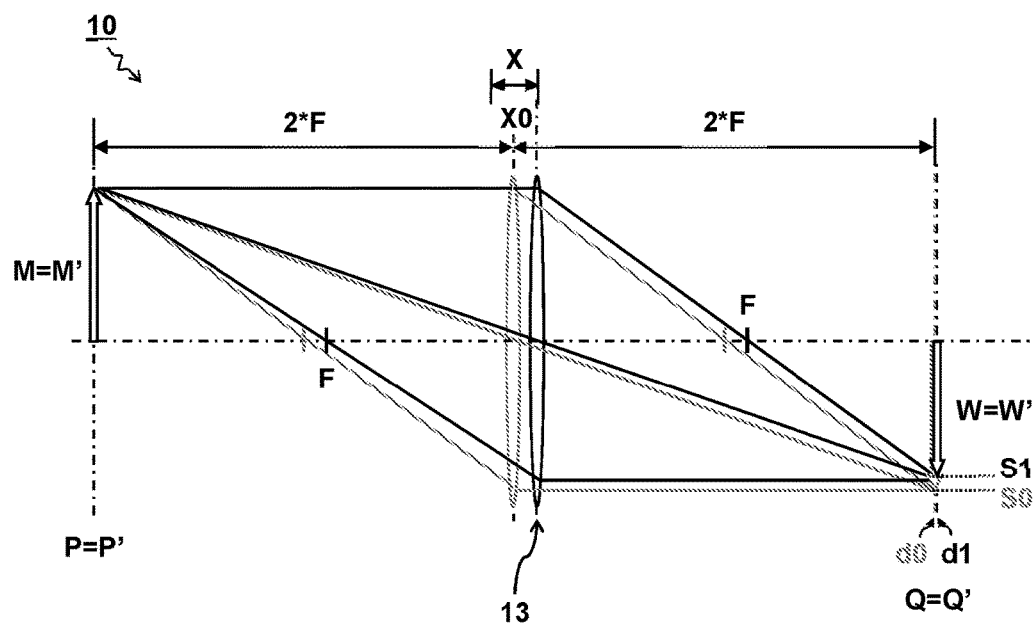
FIG. 2B illustrates the effect of moving the adjustment lens of the embodiment of FIG. 2A.

FIG. 2B illustrates the effect of moving the adjustment lens 13 to a new position X. The new situation is indicated by black lines compared to the original situation of FIG. 2A, indicated by gray lines.

As shown, movement of the adjustment lens 13 results in a corresponding movement of the focal positions F. The black light rays have been redrawn according to the new situation. It is noted that the relative displacement of a lens with respect to an object generally means that the position and size of the corresponding image can be affected. However, it will be appreciated in the present case that, while the size of the substrate pattern W has indeed been substantially altered from S0 to S1, on the other hand, the position of the projected substrate pattern W has barely displaced from the original position d0 to the new position d1. This behavior can thus be advantageously used to adjust the relative size S1/S0 of the substrate pattern W with minimal influence on the displacement d1−d0 of the image plane Q where the substrate pattern W is projected.

Figure 3A:
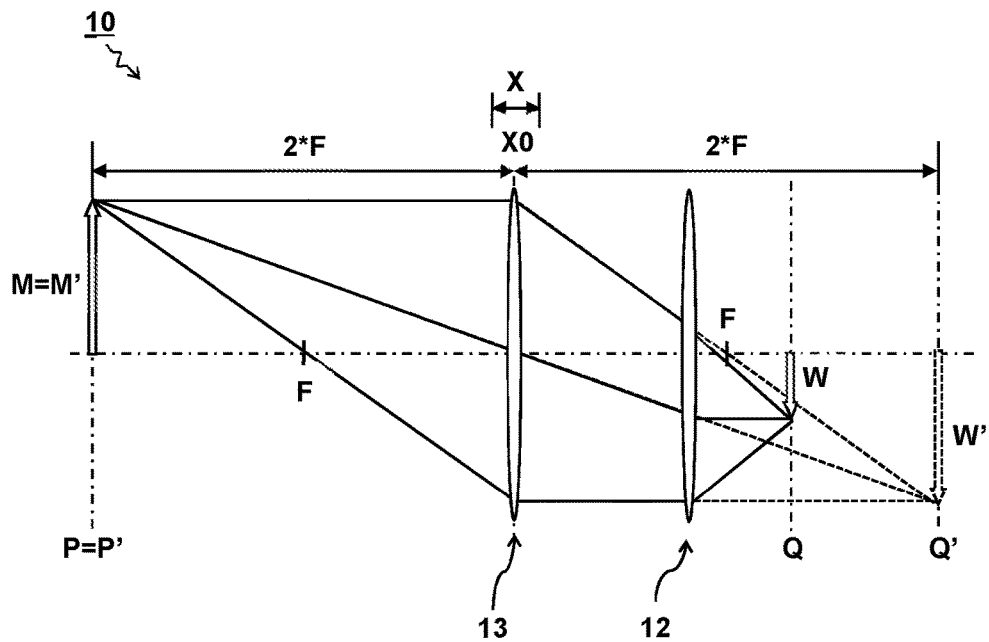
FIG. 3A shows a schematic view of another embodiment of a projection system.

FIG. 3A shows a schematic view of another embodiment of a projection system 10.

Compared to the embodiment of FIG. 2, a further lens 12 has been added on the image side of the adjustment lens 13. As shown this can result in a displacement of the image plane Q of the projection system 10 compared to the image plane Q' of the adjustment lens 13. Similarly the substrate pattern W is displaced compared to the apparent substrate pattern W' which remains at the same location from a point of view of the adjustment lens 13, as indicated by the dashed lines.

It will be noted that the additional lens 12 can result in an alteration of the size of the substrate pattern W compared to the mask pattern M. In particular, it is noted that the magnification factor is no longer unity.

Figure 3B:
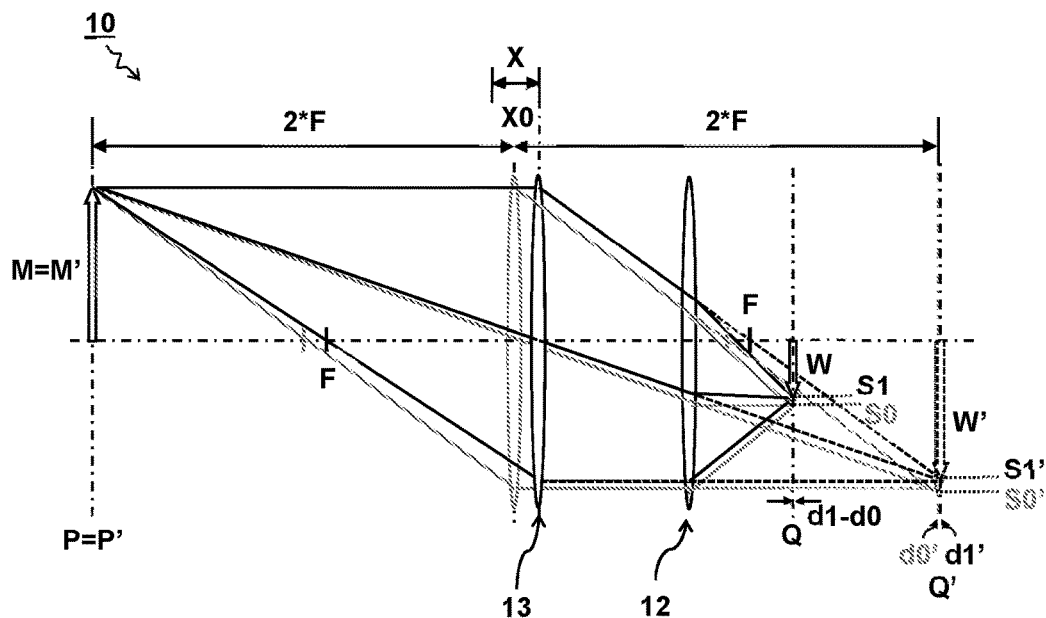
FIG. 3B illustrates the effect of moving the adjustment lens of the embodiment of FIG. 3A.

FIG. 3B illustrates the effect of moving the adjustment lens 13 to a new position X. As before, the new situation is indicated by black lines compared to the original situation of FIG. 3A, indicated by gray lines.

It is noted that the effect of the displacement on the apparent or virtual substrate pattern W' from a point of view of the adjustment lens 13 is the same as before in FIG. 2B, i.e. the image size of the dashed arrow W' is appreciably altered with minimal effect on the image position Q'. However, the projection system 10 comprises optics 12 arranged to project the substrate pattern W between the adjustment lens 13 and the image plane Q' of the adjustment lens 13. In other words, the optics 12 bring the projected substrate pattern W closer to the adjustment lens 13. It is noted that as a consequence of mapping coordinates of the substrate pattern W closer to the adjustment lens 13, the displacement of the substrate pattern W can be smaller compared to the embodiment of FIG. 2B, i.e. |d1−d0|<|d1'−d0'|. On the other hand, while the absolute image size of the projected substrate pattern W may be smaller than before, the relative image size remains the same, i.e. S1/S0=S1'/S0'. It will be appreciated that by projecting the substrate pattern W between the adjustment lens 13 and the image plane Q' of the adjustment lens 13, the desired effect can be improved of controlling the relative image size while maintaining the focal position of the projected image.

In one embodiment, the projection system 10 is arranged for projecting the substrate pattern W at an image plane Q having a distance to the adjustment lens 13 which distance is a fraction of the focal length F. Preferably, the said distance is less than 0.5 times the focal length F, more preferably, the distance is less than 0.3 times the focal length F, even more preferably less than 0.1 times the focal length F, even more preferably less than 0.05 times the focal length F, even more preferably less than 0.01 times the focal length F. The smaller the distance compared to the focal length, the better the maintenance of the image plane position while providing accurate adjustment of the relative image size, especially when using a relatively weak adjustment lens 13, e.g. having a focal length of more than 10 meters.

Figure 4A:
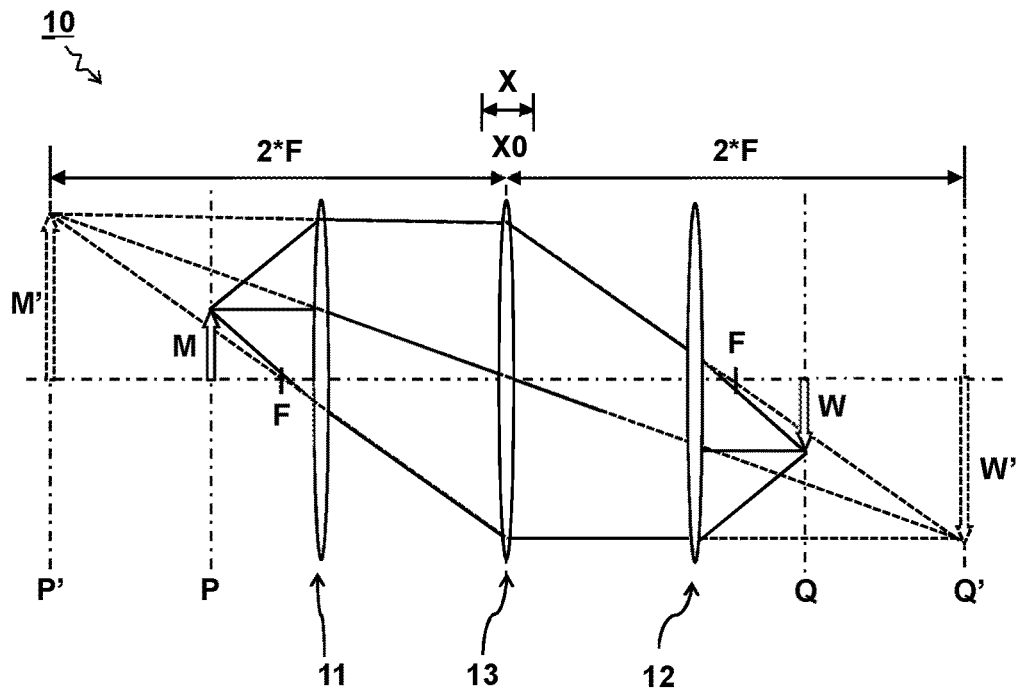
FIG. 4A shows a schematic view another embodiment of a projection system.

FIG. 4A shows a schematic view of yet another embodiment of a projection system 10.

Compared to the embodiment of FIG. 3, a further lens 11 has been added on the object side of the adjustment lens 13. As shown, this can result in an apparent object plane P' and apparent mask pattern M' from a point of view of the adjustment lens 13 (indicated by dashed lines) which no longer coincide with the actual object plane P and mask pattern M. In general the addition of optical elements between the position of the mask pattern M and the adjustment lens 13 can thus result in the alteration of an apparent position of the mask pattern M from a point of view of the adjustment lens 13. As discussed above, this apparent position or distance can e.g. be established by tracing back the light rays impinging the adjustment lens 13 to their origin, i.e. the place where the phase front impinging the adjustment lens 13 would constructively interfere in absence of the other optical elements such as lens 11.

In the embodiment shown, it is clear that the adjustment lens 13 at the central position X0 is arranged for providing a unity magnification factor (1:1) between a size of the apparent mask pattern M' and a size of the apparent substrate pattern W' from a point of view of the adjustment lens 13. Indeed, it will be appreciated that this may also apply to the other embodiments, even that of FIG. 5.

Figure 4B:
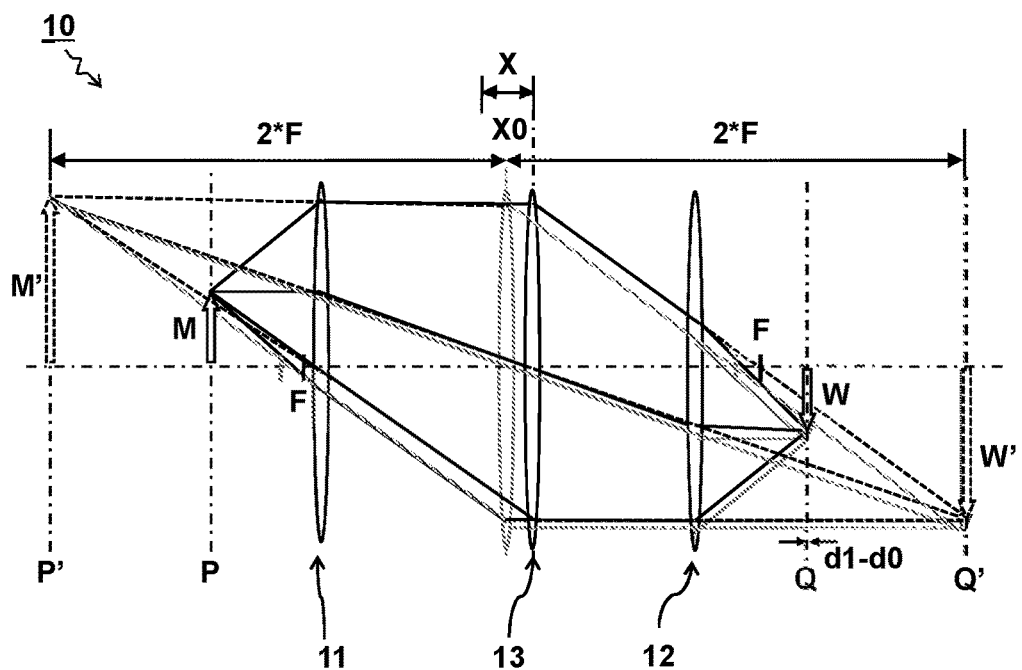
FIG. 4B illustrates the effect of moving the adjustment lens of the embodiment of FIG. 4A.

FIG. 4B illustrates the effect of moving the adjustment lens 13 to a new position X. As before, the new situation is indicated by black lines compared to the original situation of FIG. 3A, indicated by gray lines.

It may be noted the situation on the image side of the lens is the same as FIG. 3B. Accordingly, the effect of moving the adjustment lens 13 to a new position is also the same and the same advantageous effects can be achieved. This shows that the principles of the present disclosure may be applied whenever the an apparent mask pattern M' from a point of view of the adjustment lens 13 appears to be at a distance from the adjustment lens 13 that is twice a focal length F of the adjustment lens 13, irrespective of where the actual mask pattern is located.

In one embodiment, the adjustment lens 13 is arranged for controlling the relative image size S1/S0 between a range of at least 0.99-1.01 while maintaining a shift of the projected substrate pattern W within a distance of less than 0.001 times a focal length F of the adjustment lens 13 from stationary surface of the substrate 6.

Figure 5:
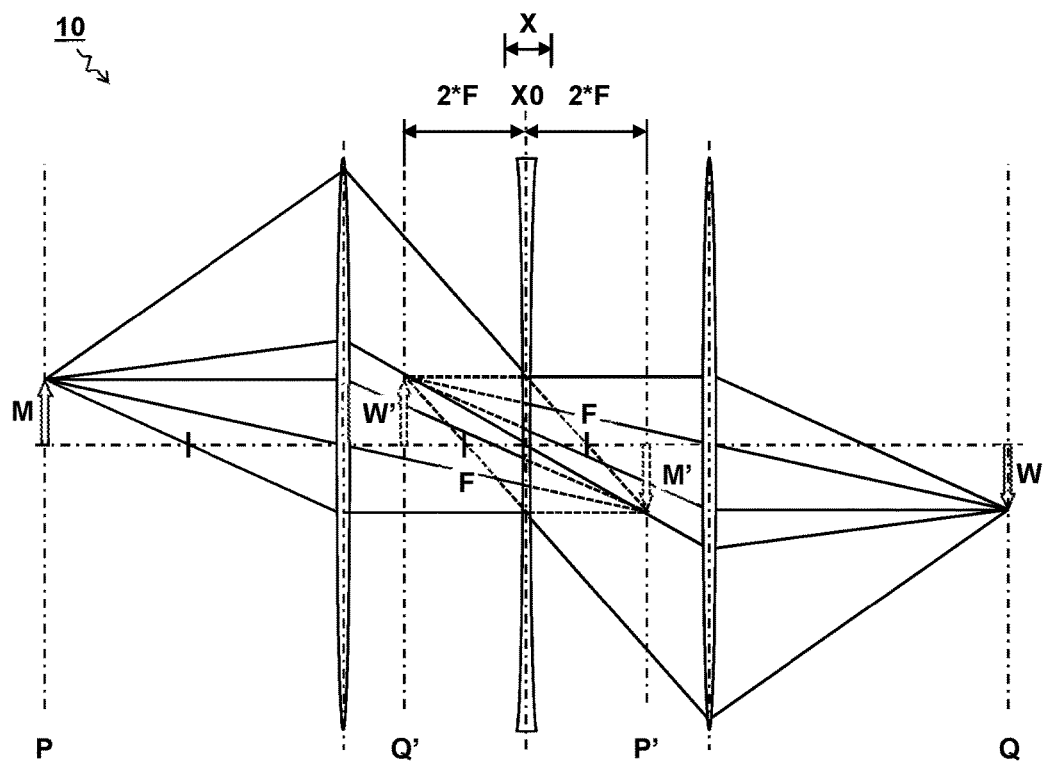
FIG. 5 shows a schematic view an embodiment of the projection comprising a negative adjustment lens.

FIG. 5 shows a schematic view of yet another embodiment of the projection system 10. In the embodiment, the adjustment lens 13 is a negative lens, i.e. concave. It may be noted that for a negative lens, the apparent mask pattern M' can appear on the image side of the lens. However, the projection system 10 can still be arranged such that the distance to the apparent mask pattern M' is twice the focal length F of the adjustment lens 13. In the convention that the focal length of a negative lens is described by a negative value, similarly, the convention may be used that an apparent (virtual) object at the image side of the lens is described by a negative distance. The embodiment shows that the principles of the present disclosure can be applied for positive and negative lenses.

It is noted for the purpose of clarity and a concise description, that features are described herein as part of the same or separate embodiments, however, it will be appreciated that the scope of the invention may include embodiments having combinations of all or some of the features described. For example, while example embodiments were shown for the projection system, also alternative ways may be envisaged by those skilled in the art having the benefit of the present disclosure for achieving a similar function and result. E.g. one or more lenses may be substituted for equivalent optical components, such as curved mirrors.

The various elements of the embodiments as discussed and shown offer certain advantages, such as a simplified yet robust projection system. Of course, it is to be appreciated that any one of the above embodiments or processes may be combined with one or more other embodiments or processes to provide even further improvements in finding and matching designs and advantages. For example, embodiments wherein devices or systems are disclosed to be arranged and/or constructed for performing a specified method or function inherently disclose the method or function as such and/or in combination with other disclosed embodiments of methods or systems. Furthermore, embodiments of methods are considered to inherently disclose their implementation in respective hardware, where possible, in combination with other disclosed embodiments of methods or systems.

Furthermore, methods that can be embodied as program instructions, e.g. on a non-transient computer-readable storage medium, are considered inherently disclosed as such embodiment. It is appreciated that this disclosure offers particular advantages to small scale optical manufacturing, and in general can be applied for any application wherein small changes in image size are desired while maintaining a critical image focus position.

Finally, the above-discussion is intended to be merely illustrative of the present systems and/or methods and should not be construed as limiting the appended claims to any particular embodiment or group of embodiments. The specification and drawings are accordingly to be regarded in an illustrative manner and are not intended to limit the scope of the appended claims. In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage. In particular, all working combinations of the claims are considered inherently disclosed.

The invention claimed is:

1. A photolithography apparatus comprising:
a mask stage arranged for positioning a mask comprising a mask pattern (M) for patterning an illumination beam (R1) according to the mask pattern (M);
a substrate stage arranged for positioning a substrate for receiving a substrate pattern (W) onto the substrate; and
a projection system arranged for projecting an image of the mask pattern (M) as the substrate pattern (W) onto the substrate, wherein the projection system comprises
an adjustment lens moveable in a range (Xmin, Xmax) encompassing a central position (X0) for controlling a relative image size (S1/S0) of the projected substrate pattern (W) by a relative position (X) of the adjustment lens, and
a controller configured to adjust the relative image size (S1/S0) of the projected substrate pattern (W) by controlling the relative position (X-X0) of the adjustment lens;
wherein the projection system is arranged to project the mask pattern (M) onto the adjustment lens such that, when the adjustment lens is positioned at the central position (X0), an apparent mask pattern (M') from a point of view of the adjustment lens appears to be at a distance (2*F) from the adjustment lens that is twice a focal length (F) of the adjustment lens.

2. A photolithography apparatus comprising:
a mask stage arranged for positioning a mask comprising a mask pattern (M) for patterning an illumination beam (R1) according to the mask pattern (M);
a substrate stage arranged for positioning a substrate for receiving a substrate pattern (W) onto the substrate; and
a projection system arranged for projecting an image of the mask pattern (M) as the substrate pattern (W) onto the substrate, wherein the projection system comprises
an adjustment lens moveable in a range (Xmin, Xmax) encompassing a central position (X0) for controlling a relative image size (S1/S0) of the projected substrate pattern (W) by a relative position (X) of the adjustment lens, and
a controller configured to adjust the relative image size (S1/S0) of the projected substrate pattern (W) by controlling the relative position (X-X0) of the adjustment lens;
wherein the projection system is arranged to project the mask pattern (M) onto the adjustment lens such that, when the adjustment lens is positioned at the central position (X0), an apparent mask pattern (M') from a point of view of the adjustment lens appears to be at a distance (2*F) from the adjustment lens that is twice a focal length (F) of the adjustment lens,
the apparatus further comprising an image sensor arranged for detecting an image size (S) of the projected substrate pattern (W), wherein the controller is configured to adjust the position (X) of the adjustment lens as a function of the detected image size (S) for obtaining a desired image size.

3. The apparatus according to claim 1, wherein the adjustment lens is moveable as a single unit without optical elements therein between.

4. The apparatus according to claim 1, wherein the adjustment lens comprises a single lens element.

5. The apparatus according to claim 1, wherein an absolute value (|F|) of the focal length (F) of the adjustment lens is more than 10 meters.

6. The apparatus according to claim 1, wherein the projection system is arranged for projecting the substrate pattern (W) at an image plane (Q) of the projection system having a distance to the adjustment lens which distance is a fraction of the focal length (F), wherein the fraction is less than 0.1.

7. The apparatus according to claim 1, wherein the projection system comprises a track along an optical axis (OA) of the projection system for moving the adjustment lens along the track, wherein the adjustment lens is arranged to be moveable on the track over a maximum distance (Xmax) from the central position (X0), wherein the maximum distance (Xmax) is less than one-hundredth (0.01) of the focal length (F).

8. The apparatus according to claim 1, wherein the projection system is arranged with respect to the adjustment lens such that a degree of collimation of light (R3) entering the adjustment lens equals a degree of collimation of light (R4) exiting the adjustment lens when the adjustment lens is at the central position (X0).

9. The apparatus according to claim 1, wherein the projection system comprises a collimating system arranged between the mask stage and the adjustment lens for increasing a degree of collimation of patterned light (R2) from the mask pattern (M) for projecting the patterned light with increased collimation (R3) onto the adjustment lens for increasing the apparent distance of the apparent mask pattern (M') from the point of view of the adjustment lens.

10. The apparatus according to claim 1, wherein the projection system comprises a collimating system arranged between the mask stage and the adjustment lens to provide an apparent mask pattern (M') from a point of view of the adjustment lens that appears at a distance (2*F) that is further away from the adjustment lens than an actual distance to the mask pattern (M).

11. The apparatus according to claim 1, wherein the projection system comprises a focusing system arranged between the adjustment lens and the substrate stage for decreasing a distance between the adjustment lens and the projected substrate pattern (W) on the substrate.

12. The apparatus according to claim 1, wherein the adjustment lens has a thickness of less than 10 cm.

13. The apparatus according to claim 1, wherein the adjustment lens is arranged for controlling the relative image size (S1/S0) between a range of at least 0.99-1.01 while maintaining a shift of the projected substrate pattern (W) within a distance of less than 0.001 times a focal length (F) of the adjustment lens from stationary surface of the substrate.

14. A method for controlling a relative image size (S1/S0) of a projected substrate pattern (W) in a photolithography apparatus, the method comprising
  using a projection system for projecting the substrate pattern (W) as an image of a mask pattern (M); wherein the projection system comprises an adjustment lens for adjusting the relative image size (S1/S0) of the projected substrate pattern (W);
  adjusting the relative image size (S1/S0) of the projected substrate pattern (W) by controlling a relative position (X) of the adjustment lens around a central position (X0);
  wherein the projection system is arranged to project the mask pattern (M) onto the adjustment lens such that, when the adjustment lens is positioned at the central position (X0), an apparent mask pattern (M') from a point of view of the adjustment lens appears to be at a distance (2*F) from the adjustment lens that is twice a focal length (F) of the adjustment lens.

15. The method according to claim 14, comprising detecting an image size (S) of the projected substrate pattern (W) and adjusting the position (X) of the adjustment lens as a function of the detected image size (S) for obtaining a desired image size.

* * * * *